(12) United States Patent
Okabe (10) Patent No.: US 8,471,255 B2
(45) Date of Patent: Jun. 25, 2013

(54) BOTTOM-GATE THIN-FILM TRANSISTOR HAVING A MULTILAYERED CHANNEL AND METHOD FOR MANUFACTURING SAME

(75) Inventor: Tohru Okabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/391,427

(22) PCT Filed: Apr. 14, 2010

(86) PCT No.: PCT/JP2010/056663
§ 371 (c)(1),
(2), (4) Date: Feb. 21, 2012

(87) PCT Pub. No.: WO2011/024510
PCT Pub. Date: Mar. 3, 2011

(65) Prior Publication Data
US 2012/0146037 A1    Jun. 14, 2012

(30) Foreign Application Priority Data

Aug. 27, 2009  (JP) ................ 2009-196384

(51) Int. Cl.
| H01L 29/04 | (2006.01) |
|---|---|
| H01L 29/10 | (2006.01) |
| H01L 31/036 | (2006.01) |
| H01L 31/0376 | (2006.01) |
| H01L 31/20 | (2006.01) |
| H01L 29/76 | (2006.01) |
| H01L 31/112 | (2006.01) |
| H01L 21/00 | (2006.01) |
| H01L 21/84 | (2006.01) |

(52) U.S. Cl.
USPC  257/57; 257/66; 257/E29.117; 257/E29.151; 257/E29.202; 257/E29.273; 438/149; 438/151; 438/158; 438/164

(58) Field of Classification Search
USPC ....... 257/57, 66, E29.117, E29.151, E29.202, 257/E29.273; 438/149, 151, 158, 164
See application file for complete search history.

(56) References Cited

U.S. PATENT DOCUMENTS

| 4,905,066 A | * | 2/1990 | Dohjo et al. | 257/60 |
| 5,005,056 A | * | 4/1991 | Motai et al. | 257/52 |
| 5,017,984 A | * | 5/1991 | Tanaka et al. | 257/59 |

(Continued)

FOREIGN PATENT DOCUMENTS

| JP | 09-115831 A | 5/1997 |
| JP | 2005-167051 A | 6/2005 |
| JP | 2008-124392 A | 5/2008 |

*Primary Examiner* — Ida M Soward
(74) *Attorney, Agent, or Firm* — Chen Yoshimura LLP (57) ABSTRACT

Provided is a thin film transistor, wherein the on-off ratio thereof is increased by decreasing the OFF current thereof. A bottom-gate TFT (10) is provided with a channel layer (40) obtained by forming a second silicon layer (35) on a first silicon layer (30). Since amorphous silicon regions (32), which surround multiple grains (31) contained in the first silicon layer (30), contain hydrogen in an amount sufficient to enable termination of dangling bonds, most of dangling bonds in the amorphous silicon region (32) are terminated by hydrogen. For this reason, it becomes less likely to have defect levels formed in the amorphous silicon regions (32), and an OFF current that flows through defect levels is therefore decreased. A high number of the grains (31) are retained in the first silicon layer (30), and cause a large ON current to flow. Consequently, the on-off ratio of the TFT (10) is increased.

9 Claims, 6 Drawing Sheets

U.S. PATENT DOCUMENTS

| | | | |
|---|---|---|---|
| 5,780,871 A * | 7/1998 | den Boer et al. | 257/59 |
| 5,909,615 A * | 6/1999 | Kuo | 438/157 |
| 5,942,767 A * | 8/1999 | Na et al. | 257/59 |
| 6,025,216 A * | 2/2000 | Ha | 438/161 |
| 6,104,042 A * | 8/2000 | Sah | 257/59 |
| 6,225,644 B1 * | 5/2001 | Yamaguchi et al. | 257/59 |
| 6,710,411 B2 * | 3/2004 | Moon | 257/349 |
| 7,915,101 B2 * | 3/2011 | Jeong et al. | 438/151 |
| 7,923,722 B2 * | 4/2011 | Ryu et al. | 257/43 |
| 8,232,551 B2 * | 7/2012 | Kim et al. | 257/43 |
| 8,395,158 B2 * | 3/2013 | Yamazaki et al. | 257/59 |
| 8,405,161 B2 * | 3/2013 | Park et al. | 257/401 |
| 2006/0024866 A1 * | 2/2006 | Gan et al. | 438/149 |
| 2009/0242889 A1 * | 10/2009 | Nakayama | 257/59 |

* cited by examiner

BOTTOM-GATE THIN-FILM TRANSISTOR HAVING A MULTILAYERED CHANNEL AND METHOD FOR MANUFACTURING SAME

TECHNICAL FIELD

The present invention relates to a thin film transistor and a method for manufacturing the same. To be more specific, the present invention relates to a thin film transistor that is suited for an active matrix type display device such as a liquid crystal display device and an organic electroluminescence (hereinafter referred to as an "EL") display device, and to a method for manufacturing the same.

BACKGROUND ART

A thin film transistor (hereinafter referred to as a "TFT") has been conventionally used as a switching element of the pixel forming portion in an active matrix type liquid crystal display device. However, in recent years, in order to lower the manufacturing cost of a liquid crystal display device, a TFT has started to be used not only as a switching element of the pixel forming portion, but also for a driver circuit formed in the frame portion of a panel. Along with this trend, the development of a TFT equipped with a channel layer made up of microcrystalline silicon or polycrystalline silicon (hereinafter referred to as "crystalline silicon"), which have larger mobility than amorphous silicon, has been promoted.

However, there is a problem such that a current flowing from a drain electrode to a source electrode during a powered-off state (hereinafter referred to as an "OFF current") becomes larger in a TFT equipped with the channel layer made up of crystalline silicon as compared to a TFT equipped with the channel layer made up of amorphous silicon.

Figure 14:
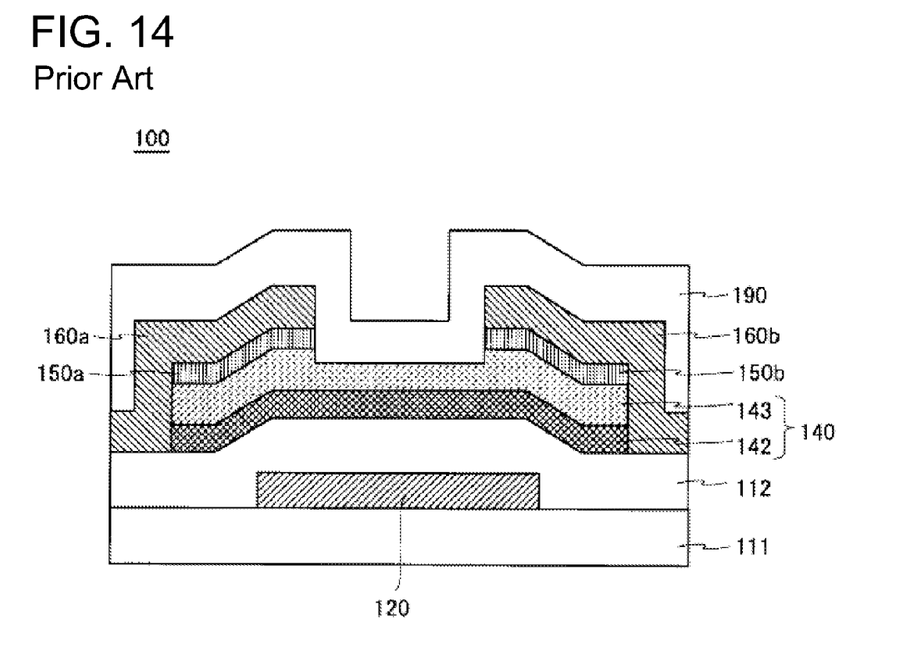
FIG. 14 is a cross-sectional view showing a configuration of a conventional bottom-gate TFT.

In view of this, Japanese Patent Application Laid-Open Publication No. 2005-167051 suggests a bottom-gate TFT equipped with a channel layer having an amorphous silicon layer, and a microcrystalline silicon layer laminated thereon. FIG. 14 is a cross-sectional view showing the configuration of a conventional bottom-gate TFT 100 described in Japanese Patent Application Laid-Open Publication No. 2005-167051. As shown in FIG. 14, in the TFT 100, a gate electrode 120 is formed on a glass substrate 111, and a gate insulation film 112 is formed so as to cover the entire glass substrate 111 including the gate electrode 120. A microcrystalline silicon layer 142 is formed by performing laser-annealing of an amorphous silicon layer formed on the gate insulation film 112, and an amorphous silicon layer 143 is further formed on the microcrystalline silicon layer 142. The microcrystalline silicon layer 142 and the amorphous silicon layer 143 function as a channel layer 140 of the TFT 100. Formed on the left and right edges of the amorphous silicon layer 143 are ohmic contact layers 150*a* and 150*b*, which are made up of amorphous silicon doped with an n-type impurity in high concentration and each of which functions as a source or a drain. A source electrode 160*a*, which extends from the upper right edge portion of the ohmic contact layer 150*a* to the left direction, is formed, and a drain electrode 160*b*, which extends from the upper left edge of the ohmic contact layer 150*b* to the right direction, is formed. A protective film 190 is further formed so as to cover the entire TFT 100.

RELATED ART DOCUMENTS

Patent Documents

Patent Document 1: Japanese Patent Application Laid-Open Publication No. 2005-167051

SUMMARY OF THE INVENTION

Problems to be Solved by the Invention

However, the TFT 100 shown in FIG. 14 has the following problems. The microcrystalline silicon layer 142, which has been crystallized by performing laser annealing of an amorphous silicon layer, has a large number of crystal grains (grains) made of silicon single-crystals and a large number of crystal grain boundaries (grain boundaries), which are formed so as to surround the respective grains. A large number of silicon dangling bonds are contained in the grain boundaries, and the dangling bonds are forming defect levels. An OFF current flows through such defect levels. Here, if a large amount of hydrogen contained in the grain boundaries is used to terminate the dangling bonds, the formation of defect levels is suppressed, and the OFF current is therefore decreased.

Meanwhile, if a large amount of hydrogen is contained in the grain boundaries, this creates a problem such that a surface of the microcrystalline silicon layer becomes rough when laser annealing is performed on the amorphous silicon layer to form the microcrystalline silicon layer. Therefore, if hydrogen is eliminated by carrying out high temperature annealing on the amorphous silicon layer, and laser-annealing is performed afterward, the surface of the microcrystalline silicon layer does not become rough. However, because hydrogen contained in the grain boundaries of the microcrystalline silicon layer is decreased, a large number of dangling bonds, which are not terminated by hydrogen, remain in the grain boundaries, forming defect levels. When such a microcrystalline silicon layer 142, which was formed by carrying out laser-annealing, and the amorphous silicon layer 143 are laminated to form the channel layer 140 of the TFT 100, a problem remains such that even though mobility increases as compared to a TFT having the channel layer made up of only an amorphous silicon layer, the OFF current also increases.

Furthermore, in order to decrease the OFF current, hydrogenation is also performed after the source electrode and the drain electrode are formed so that hydrogen is supplied to the grain boundaries of the microcrystalline silicon layer. However, in the bottom-gate TFT 100, the grain boundaries of the microcrystalline silicon layer 142 is formed at its interface with the gate insulation film 112, and therefore, even though hydrogenation is performed, it is difficult to supply a sufficient amount of hydrogen to the grain boundaries of the microcrystalline silicon layer 142. As just described, even though the hydrogenation is performed, a problem remains such that silicon dangling bonds, which form defect levels in the grain boundaries, cannot be terminated sufficiently, and the OFF current in the TFT 100 cannot be decreased.

Moreover, in an attempt to decrease the OFF current, an LDD region may sometimes be formed adjacent to each of the source and the drain of the TFT. However, photolithography and a step of injecting impurities such as ion-doping become necessary in order to form an LDD region, resulting in a problem of higher manufacturing costs of the TFT and complicated manufacturing processes.

Here, an object of the present invention is to decrease the OFF current and to provide a TFT having the large on-off ratio. Furthermore, another object of the present invention is to provide a manufacturing method that enables an easy manufacturing of a TFT having the large on-off ratio at a low manufacturing cost.

Means for Solving the Problems

A first aspect of the present invention is a bottom-gate thin film transistor formed on an insulating substrate, including: a gate electrode formed on the insulating substrate; a gate insulation film formed so as to cover the insulating substrate including the gate electrode; and a channel layer including a first semiconductor layer formed on the gate insulation film and a second semiconductor layer formed on the first semiconductor layer, wherein the first semiconductor layer contains a plurality of grains and amorphous semiconductor regions that are made of first amorphous semiconductor and that fill gaps surrounded by the grains, and wherein the amorphous semiconductor regions contain hydrogen in an amount sufficient to terminate dangling bonds contained therein.

A second aspect of the present invention is the first aspect of the present invention, wherein the second semiconductor layer is made of second amorphous semiconductor, and wherein a concentration of hydrogen contained in the second semiconductor layer is equal to a concentration of hydrogen contained in the amorphous semiconductor regions.

A third aspect of the present invention is a display device equipped with the thin film transistor according to the first aspect of the present invention.

A fourth aspect of the present invention is a method for manufacturing a bottom-gate thin film transistor formed on an insulating substrate, including: forming a gate electrode on the insulating substrate; forming a gate insulation film so as to cover the insulating substrate including the gate electrode; and forming a channel layer on the gate insulation film, wherein the step of forming the channel layer includes: forming a crystalline semiconductor layer on the gate insulation film, removing grain boundaries contained in the crystalline semiconductor layer to form gaps, and forming a first amorphous semiconductor layer in the gaps in the crystalline semiconductor layer and on the crystalline semiconductor layer.

A fifth aspect of the present invention is the fourth aspect of the present invention, wherein the step of forming the crystalline semiconductor layer includes: forming a second amorphous semiconductor layer on the gate insulation film; and performing laser annealing of the second amorphous semiconductor layer for crystallization.

A sixth aspect of the present invention is the fifth aspect of the present invention, wherein a film thickness of the second amorphous semiconductor layer is a film thickness in which sidewalls of the grain boundaries, which are formed when performing laser annealing on the second amorphous semiconductor layer, become approximately perpendicular to the gate insulation film.

A seventh aspect of the present invention is the fifth aspect of the present invention, wherein the first amorphous semiconductor layer is formed such that a ratio of a film thickness of the second amorphous semiconductor layer to a total film thickness of the first amorphous semiconductor layer's film thickness and the second amorphous semiconductor layer's film thickness becomes smaller than a variation ratio in film thickness of the first amorphous semiconductor layer.

An eighth aspect of the present invention is the fourth aspect of the present invention, wherein the step of removing the grain boundaries contained in the crystalline semiconductor layer to form the gaps includes performing a wet etching using an etchant having nitric acid and hydrofluoric acid as main components thereof.

A ninth aspect of the present invention is the fourth aspect of the present invention, wherein the crystalline semiconductor layer is a microcrystalline semiconductor layer formed by a high density plasma CVD method.

Effects of the Invention

According to the first aspect of the present invention, an amorphous semiconductor region is formed so as to surround a plurality of grains in the first semiconductor layer, and the amorphous semiconductor region contains hydrogen in an amount sufficient to enable termination of dangling bonds contained therein. Accordingly, most of the dangling bonds in the amorphous semiconductor region are terminated by hydrogen, and therefore, defect levels are rarely formed in the amorphous semiconductor region, and an OFF current that flows through defect levels is therefore decreased. Meanwhile, because the grains remain in the first semiconductor layer, a large ON current flows. This makes it possible to increase the on-off ratio of the TFT.

According to the second aspect of the present invention, the concentration of hydrogen contained in the second semiconductor layer is sufficiently high, as is the case for the concentration of hydrogen contained in the amorphous semiconductor region, and therefore, most of dangling bonds contained in the second semiconductor layer are terminated by hydrogen. Accordingly, because the occurrence of defect levels is also suppressed in the second semiconductor layer, an off-current that flows through defect levels is further decreased. As a result, the on-off ratio of the TFT can be increased.

According to the third aspect of the present invention, because the on-off ratio can be increased in the TFT according to the first or second aspect of the present invention, the TFT is used as a switching element of a pixel forming portion in a display device. Furthermore, because an OFF current can be decreased, the TFT is also used for a monolithic type driver circuit that drives a pixel forming portion.

According to the fourth aspect of the present invention, a crystalline semiconductor layer is formed on the gate insulation film, and grain boundaries contained in the crystalline semiconductor layer are removed to form a gap. Next, a first amorphous semiconductor layer is formed in the gap and on the crystalline semiconductor layer. Because a large amount of hydrogen is contained in the formed first amorphous semiconductor layer, most of dangling bonds contained in the first amorphous semiconductor layer in the gap are terminated by hydrogen. Accordingly, defect levels are not likely to be formed in the first amorphous semiconductor region in the gap, and an OFF current that flows in the crystalline semiconductor film on the gate insulation film therefore is decreased. Meanwhile, because the grains remain in the crystalline semiconductor layer, a large ON current flows. As a result, the TFT having the large on-off ratio can be easily manufactured.

According to the fifth aspect of the present invention, the crystalline semiconductor layer is formed by crystallizing the second amorphous semiconductor layer by performing laser-annealing thereon, and therefore, the size of the grains and the size of the grain boundaries can easily be adjusted by changing the setting of the laser-annealing conditions. This makes it possible to easily adjust the size of the ON current and the OFF current, and a TFT having the large on-off ratio can be easily manufactured.

According to the sixth aspect of the present invention, the sidewalls of the grain boundaries, which are formed by carrying out laser-annealing on the second amorphous semiconductor layer, become approximately perpendicular to the gate insulation film, and therefore, it becomes easier to etch the grain boundaries. As a result, the TFT having the large on-off ratio can be easily manufactured.

According to the seventh aspect of the present invention, the film thickness of the first amorphous semiconductor layer is formed such that the ratio of the second amorphous semiconductor layer's film thickness to the total film thickness of the first amorphous semiconductor layer and the second amorphous semiconductor layer's film thickness becomes smaller than the ratio of a variation in film thickness of the first amorphous semiconductor layer. Therefore, it is possible to easily manufacture a TFT having a flat surfaced first amorphous semiconductor layer. This makes it possible to improve the coatability of a metal film for forming a source electrode and a drain electrode, and that of a protective film and the like formed above the channel layer, and therefore, a TFT having the large on-off ratio can be easily manufactured. Further, it is possible to suppress a characteristic in-plane variation of the TFT formed on a large insulating substrate, and to secure the stability when aging occurs over a long period of time.

According to the eighth aspect of the present invention, because a wet-etching is used to remove the grain boundaries inside the crystalline semiconductor layer, the grain boundaries can be easily removed. Moreover, an oxide film, which is formed on a surface of the crystalline semiconductor layer when laser-annealing is carried out on the amorphous semiconductor layer to form the crystalline semiconductor layer, is also etched at the same time the grain boundaries are removed. As a result, there is no need to add a step of removing the oxide film, and the TFT can be easily manufactured at a low manufacturing cost.

According to the ninth aspect of the present invention, the microcrystalline semiconductor layer is directly formed by a high density plasma CVD method, and therefore, a laser-annealing step and a laser-annealing device become unnecessary. As a result, the TFT having the large on-off ratio can be easily manufactured at a low manufacturing cost.

BRIEF DESCRIPTION OF THE DRAWINGS

FIG. 3 (A) is an enlarged cross-sectional view showing a configuration of a channel layer of a conventional TFT, and FIG. 3(B) is an enlarged cross-sectional view showing the configuration of a channel layer of the TFT shown in FIG. 2.

FIG. 4 (A) is a plan view showing a manufacturing step of the TFT shown in FIG. 2, and FIG. 4 (B) is a cross-sectional view showing a manufacturing step of the TFT shown in FIG. 2.

FIG. 5 (A) is a plan view showing a manufacturing step of the TFT shown in FIG. 2, and FIG. 5 (B) is a cross-sectional view showing a manufacturing step of the TFT shown in FIG. 2.

FIG. 6 (A) is a plan view showing a manufacturing step of the TFT shown in FIG. 2, and FIG. 6 B) is a cross-sectional view showing a manufacturing step of the TFT shown in FIG. 2.

FIG. 7 (A) is a plan view showing a manufacturing step of the TFT shown in FIG. 2, and FIG. 7 (B) is a cross-sectional view showing a manufacturing step of the TFT shown in FIG. 2.

FIG. 8 (A) is a plan view showing a manufacturing step of the TFT shown in FIG. 2, and FIG. 8 (B) is a cross-sectional view showing a manufacturing step of the TFT shown in FIG. 2.

FIG. 9 (A) is a plan view showing a manufacturing step of the TFT shown in FIG. 2, and FIG. 9 (B) is a cross-sectional view showing a manufacturing step of the TFT shown in FIG. 2.

FIG. 10 (A) is a plan view showing a manufacturing step of the TFT shown in FIG. 2, and FIG. 10 (B) is a cross-sectional view showing a manufacturing step of the TFT shown in FIG. 2.

FIG. 11 (A) is a plan view showing a manufacturing step of the TFT shown in FIG. 2, and FIG. 11 (B) is a cross-sectional view showing a manufacturing step of the TFT shown in FIG. 2.

FIG. 12 (A) is a plan view showing a manufacturing step of the TFT shown in FIG. 2, and FIG. 12 (B) is a cross-sectional view showing a manufacturing step of the TFT shown in FIG. 2.

FIG. 13 (A) is a plan view showing a manufacturing step of the TFT shown in FIG. 2, and FIG. 13 (B) is a cross-sectional view showing a manufacturing step of the TFT shown in FIG. 2.

DETAILED DESCRIPTION OF EMBODIMENTS

<1 Configuration of TFT>

Figure 1:
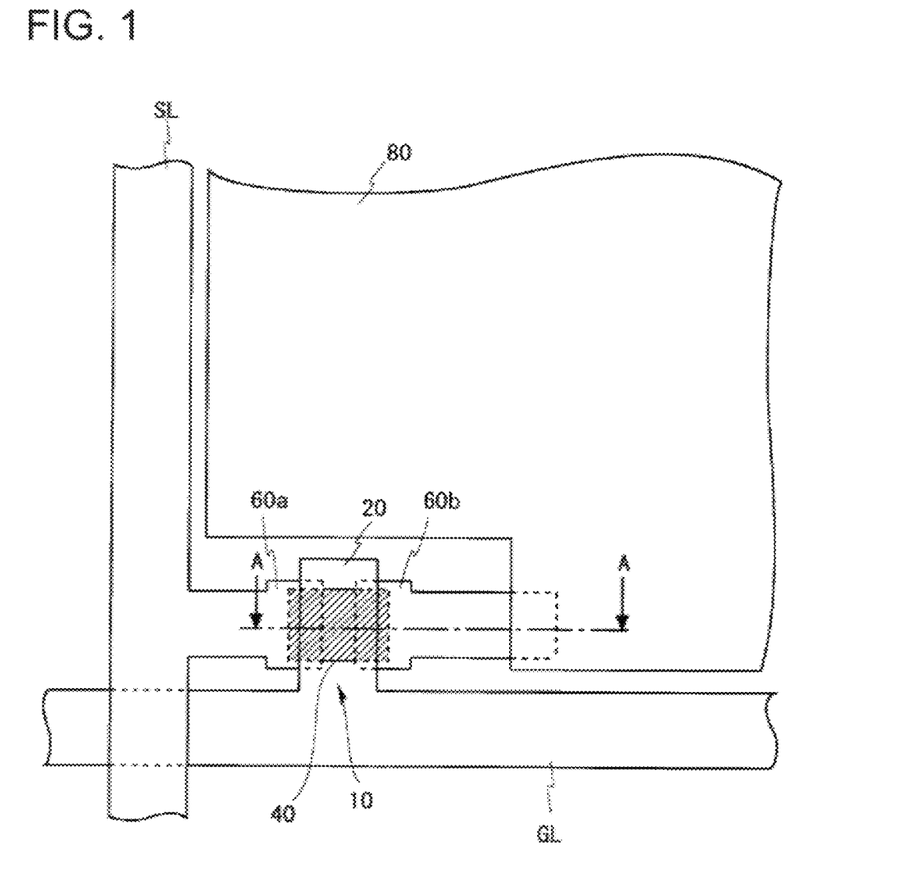
FIG. 1 is an enlarged plan view showing a part of the pixel forming portion included in a liquid crystal panel of a liquid crystal display device.

FIG. 1 is an enlarged plan view showing a part of the pixel forming portion included in a liquid crystal panel of a liquid crystal display device. Formed in the liquid crystal panel are a plurality of image signal lines SL and a plurality of scan signal lines GL that are perpendicular to each other, and a plurality of pixel forming portions, each of which is formed at respective intersections of the image signal lines SL and the scan signal lines GL. Formed in each of the pixel forming portions are: an n-channel type TFT 10 in which its gate electrode 20 is connected to a scan signal line GL extending through the corresponding intersection and its source electrode 60a is connected to an image signal line SL extending through the intersection; and a pixel electrode 80 connected to a drain electrode 60b of the TFT 10.

Figure 2:
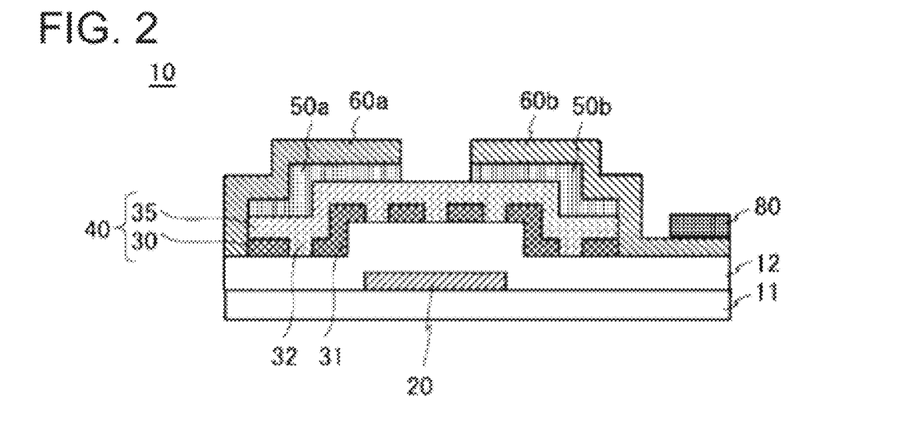
FIG. 2 is a cross-sectional view showing a configuration of the TFT 10 according to an embodiment of the present invention.

FIG. 2 is a cross-sectional view showing a configuration of the TFT 10 according to an embodiment of the present invention, and shows a cross-section of the TFT 10 along the line A-A shown in FIG. 1. As shown in FIG. 2, the TFT 10 is a bottom gate type, and a gate electrode 20, which is made of a metal such as aluminum, is formed on a glass substrate 11, which is an insulating substrate. A gate insulation film 12 is formed so as to cover the glass substrate 11 including the gate electrode 20, and a channel layer 40 is formed on the gate insulation film 12.

The channel layer 40 is composed of a first silicon layer 30 formed on the gate insulation film 12, and a second silicon layer 35 formed on the first silicon layer 30. The first silicon layer 30 is composed of a large number of silicon grains 31 and an amorphous silicon region 32 formed so as to surround the grains 31. The second silicon layer 35 is made of amorphous silicon. The grains 31 as well as the amorphous silicon region 32 included in the first silicon layer 30, and the second silicon layer 35 are all formed of intrinsic silicon that has not been doped with impurities.

Formed on a left upper surface of the second silicon layer 35 is an ohmic contact layer 50a made of amorphous silicon doped with an n-type impurity such as phosphorus (P) in high concentration. On the ohmic contact layer 50a, a source electrode 60a extending from the upper right edge of the ohmic contact layer 50a to the left side is formed.

Moreover, an ohmic contact layer 50b made of amorphous silicon doped with an n-type impurity in high concentration is formed on a right upper surface of the second silicon layer 35. On the ohmic contact layer 50b, a drain electrode 60b extending from the upper left edge of the ohmic contact layer 50b to the right side is formed. The source electrode 60a and the drain electrode 60b are made of a metal having high conductivity such as aluminum, and they are electrically connected to the second silicon layer 35, respectively, through the ohmic contact layers 50a and 50b.

The pixel electrode 80 is formed so as to cover an opening of the pixel forming portion, and a part of the pixel electrode 80 is electrically connected to the drain electrode 60b. A protective film (not shown in the figure) made of a silicon nitride film is further formed so as to cover the entire TFT 10 and to expose a surface of the pixel electrode 80.

Figure 3:
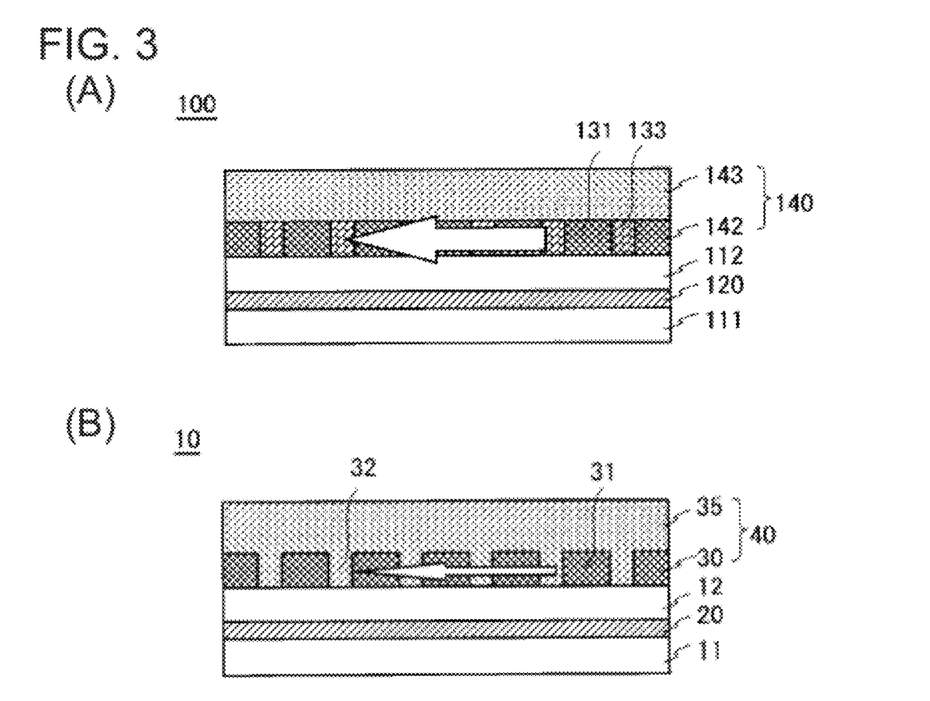

Next, the configuration of the channel layer 40 in the bottom-gate TFT 10 will be described in detail. FIG. 3(A) is an enlarged cross-sectional view showing the configuration of the channel layer 140 in the conventional TFT 100 shown in FIG. 14, and FIG. 3(B) is an enlarged cross-sectional view showing the configuration of the channel layer 40 in the TFT 10 shown in FIG. 2. First, the configuration of the conventional channel layer 140 will be described with reference to FIG. 3(A). A microcrystalline silicon layer 142 formed on the gate insulation film 112 is created by carrying out laser-annealing on an amorphous silicon layer (not shown in the figure), which was formed on the gate insulation film 112. Therefore, the microcrystalline silicon layer 142 contains a large number of grains 131 made of silicon single-crystals and grain boundaries 133 that are formed so as to surround the grains 131 where crystallization is insufficient. The larger the size of the grains 131 is, the better, and the smaller the size of the grain boundaries 133 is, the better. Therefore, in the TFT 100, the size of the grains 131 is set to 10 to 50 nm and the size of the grain boundaries 133 is set to 1 to 5 nm in the microcrystalline silicon layer 142 by optimizing the laser beam energy.

Hydrogen gas contained in the amorphous silicon layer would be removed from the amorphous silicon layer abruptly when laser-annealing is carried out, causing a surface roughness of and abrasion in the microcrystalline silicon layer 142. Therefore, in order to eliminate hydrogen contained in the amorphous silicon layer in advance, high-temperature annealing is carried out on the amorphous silicon layer before irradiating the amorphous silicon layer with laser beam. As a result, the grain boundaries 133 in the microcrystalline silicon layer 142 formed by laser annealing contains hydrogen only in lower concentration (several percent) as compared to the concentration of hydrogen usually contained in the amorphous silicon layer when it is formed (10% or more).

Hydrogen contained in the grain boundaries 133 has a role of terminating silicon dangling bonds in the grain boundaries 133. However, as described above, the concentration of hydrogen inside the grain boundaries 133 is several percent, which is considerably low, and therefore, most of the silicon dangling bonds in the grain boundaries 133 are not terminated by hydrogen, and form defect levels. As a result, a large number of defect levels are formed in the grain boundaries 133. Because an OFF current in the TFT 100 flows through such defect levels, there is a problem such that the OFF current also increases when defect levels increase, as shown by the arrow in FIG. 3(A). Here, because the grains 131 are composed of single-crystal silicon, dangling bonds rarely exist in the grains 131. Accordingly, even though the concentration of hydrogen inside the grains 131 is low, defect levels are rarely formed inside the grains 131.

Next, the configuration of the channel layer 40 in the TFT 10 according to the present embodiment will be described with reference to FIG. 3(B). As described above, the channel layer 40 of the TFT 10 is composed of the first silicon layer 30 formed on the gate insulation film 12, and the second silicon layer 35 formed on the first silicon layer 30. Formed in the first silicon layer 30 are a large number of grains 31 made of single-crystal silicon, and an amorphous silicon region 32 formed so as to surround the grains 31. Here, the second silicon layer 35 is made of amorphous silicon.

In this case, if the hydrogen concentration of the amorphous silicon region 32 included in the first silicon layer 30 can be made high (10% or more, for example) that is nearly equal to the hydrogen concentration of the amorphous silicon included in the second silicon layer 35 immediately after it was formed, the amorphous silicon region 32 will contain hydrogen in an amount sufficient to enable termination of all the dangling bonds in the amorphous silicon region 32. In the case, most of the dangling bonds in the amorphous silicon region 32 are terminated by hydrogen, and defect levels are barely formed in the amorphous silicon region 32. Accordingly, as shown by the arrow in FIG. 3(B), an OFF current flowing in the first silicon layer 30 is decreased significantly. Furthermore, the amorphous silicon region 32 in the first silicon layer 30 and the second silicon layer 35 may be formed in the same step, or may be formed in different steps. However, the amorphous silicon region 32 and the second silicon layer 35 are electrically connected to each other in each case.

Figure 4:
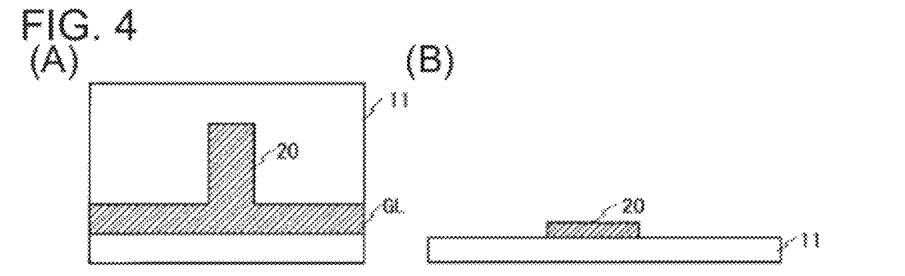

<2. Method for manufacturing TFT>FIGS. 4 to 13 are figures showing respective manufacturing steps of the TFT 10 shown in FIG. 2. Specifically, (A) of the respective figures are plan views showing each manufacturing step of the TFT 10 shown in FIG. 2, and (B) of the respective figures are cross-sectional views showing each manufacturing step of the TFT 10 shown in FIG. 2. As shown in FIGS. 4(A) and 4(B), a multilayer metal film (not shown in the figure) having an titanium (Ti) layer, an aluminum (Al) layer, and an titanium layer being laminated in this order is formed on the glass substrate 11, which is an insulating substrate, by sputtering. As for the film thickness of the respective layers constituting the multilayer metal film, the respective titanium layers in the upper and lower layers are set to 40nm, and the aluminum layer interposed therebetween is set to 400nm, for example. A resist pattern in a desired shape (not shown in the figure) is formed on the multilayer metal film using photolithography. Next, the multilayer metal film is etched by a dry-etching method using the resist pattern as a mask to form the gate electrode 20, and the resist pattern is peeled afterward.

Figure 5:
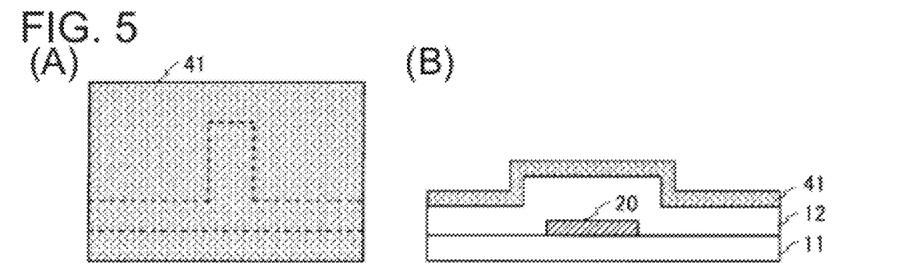

As shown in FIGS. 5(A) and 5(B), the gate insulation film 12 is formed by the Plasma Enhanced Chemical Vapor Deposition (hereinafter referred to as the "plasma CVD method") so as to cover the glass substrate 11 including the gate electrode 20. The gate insulation film 12 is made of a silicon nitride (SiNx) film, and the film thickness is set to 400nm, for example.

Next, an amorphous silicon layer 41 with a film thickness ranging from 10 to 30 nm is formed on the gate insulation film 12 by the plasma CVD method. The condition under which the amorphous silicon layer 41 is being formed is that the pressure inside a chamber of the plasma CVD device is set to $1.00 \times 10^2$ to $2.00 \times 10^2$ Pa, and monosilane ($SiH_4$) and hydrogen ($H_2$) are used as source gases, for example. The flow ratio of monosilane/hydrogen is set to 1/10 to 1/1, and the temperature of the substrate is set to 180 to 350° C. Furthermore, in order to prevent impurities or the like to be attached to the interface between the gate insulation film 12 and the amorphous silicon layer 41 which would form interface states, it is preferable that the gate insulation film 12 and the amorphous silicon layer 41 be formed continuously.

The reason for setting a film thickness of the amorphous silicon layer 41 to a range between 10 nm and 30 nm will be explained. If the film thickness of the amorphous silicon layer 41 is set larger than 30 nm, the grains 31 in the microcrystalline silicon layer 42 become larger when laser annealing is carried out, and therefore, the mobility of the TFT 10 can be improved. However, in such case, the film thickness of an amorphous silicon layer 43 necessary to planarize a surface of the second silicon layer 35, which will be described later, would become too large, causing a problem of a decrease in production efficiency. Meanwhile, if the film thickness is set smaller than 10 nm, there is a problem such that the grains 31 having the size of 10 nm or larger cannot be formed even though laser-annealing is carried out, as described later.

Figure 6:
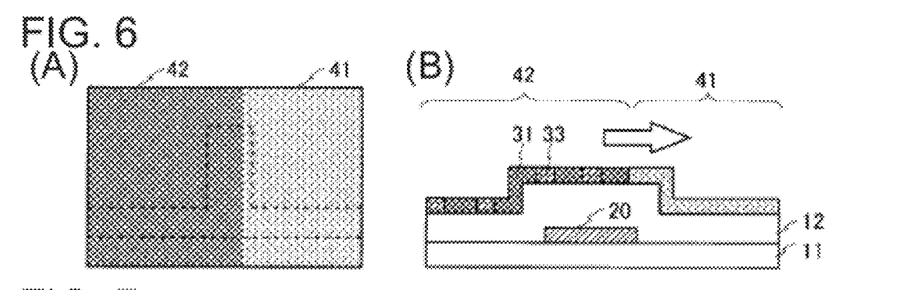

As shown in FIGS. 6(A) and 6(B), after the amorphous silicon layer 41 is formed, the amorphous silicon layer 41 is irradiated with laser-beam while scanning excimer laser from the left side to the right side in a direction parallel to the amorphous silicon layer 41. The amorphous silicon layer 41 is melted and re-crystallized to become a crystalline silicon layer 42. The size of the grains contained in the re-crystallized crystalline silicon layer 42 is determined by the output energy of excimer laser being used. In the TFT 10 of the present embodiment, it is preferable that the microcrystalline silicon layer 42 having the grains 31 with the grain size ranging between 10 nm and 50 nm be formed. This is due to the following reasons. That is, it is difficult to improve the mobility of the TFT 10 having the channel layer 40 containing grains with the grain size smaller than 10 nm. Further, if grains with the grain size of 50 nm or larger are contained, the mobility of the TFT 10 becomes limited due to the second silicon layer 35, which will be described later, and therefore, there is no practical advantage in making the grain size larger. The mobility of the TFT 10 equipped with the channel layer 40 containing the grains 31 with the grain size ranging between 10 nm and 50 nm as described above is 2 to 5 cm$^2$/V·sec, and therefore, the TFT 10 is suited for a switching element of the pixel forming portion in a liquid crystal display device. Moreover, when the TFT 10 having such a mobility is used, a gate driver of a liquid crystal display device can be monolithically designed, and therefore, the gate driver can be formed directly on the glass substrate to narrow the frame portion of the liquid crystal display device or to lower the manufacturing costs.

In order to set the grain size of the microcrystalline silicon layer 42 to a range between 10 nm and 50 nm, xenon chloride (XeCl) excimer laser (wave length of 308 nm) is used, and its output energy is set to 200 to 250 mJ/cm$^2$, for example. Here, in place of xenon chloride excimer laser, xenon fluoride (XeF) excimer laser (wavelength of 353 nm), krypton fluoride (KrF) excimer laser (wavelength of 248 nm) or the like may be used to carry out laser-annealing on the amorphous silicon layer 41. In this case, because a film thickness of the amorphous silicon layer 41 is 10 nm to 30 nm, which is thin, when the amorphous silicon layer 41 is crystallized by laser-annealing, sidewalls of the grain boundaries 33 in the microcrystalline silicon layer 42 become approximately perpendicular to the gate insulation film 12.

Figure 7:
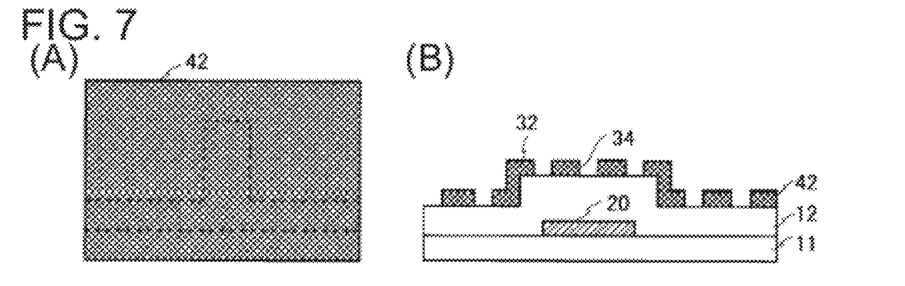

As shown in FIGS. 7(A) and 7(B), silicon in the grain boundaries 33 is removed by a wet-etching method. Etchant used in a wet-etching method is a solution containing nitrite acid (HNO$_3$), hydrofluoric acid (HF), and acetic acid (CH$_3$COOH). Silicon is oxidized by nitride acid, which is the main component of the etchant, and the oxidized silicon is dissolved by hydrofluoric acid. Therefore, silicon is etched by this etchant. The composition of the etchant is represented by the formula (1) below, for example.

Nitrite acid:Hydrofluoric acid:Acetic acid=10:3:1     (1)

The etching speed of the etchant differs depending on the crystalline structure of the microcrystalline silicon layer 42, and the selectivity between the grain boundaries 33 and the grains 31 (the etching speed of the grain boundaries 33/the etching speed of the grains 31) is 10 or more. Accordingly, even though the grain boundaries 33 are removed by etching, the grains 31 are barely etched. After etching is carried out, the grains 31 remain on the gate insulation film 12 and gaps 34 are formed at the locations where the grain boundaries 33 have been removed. In this case, because the sidewalls of the grain boundaries 33 in the microcrystalline silicon layer 42 are formed approximately perpendicular to the gate insulation film 12, it is easy for the etchant to penetrate to the grain boundaries 33. Accordingly, the grain boundaries 33 are easily removed and the gaps 34 are formed. Furthermore, instead of a wet-etching method, a dry-etching method using hydrogen gas may be carried out to remove the grain boundaries 33 to form the gaps 34.

When the amorphous silicon layer 41 is irradiated with laser-beam, an oxidized silicon film (not shown in the figure) with a film thickness of approximately several nanometers is formed on a surface of the microcrystalline silicon layer 43 by oxygen gas contained in the surrounding atmosphere. However, when dipped in the etchant in order to remove the grain boundaries 33, this oxidized silicon film is etched at the same time by hydrofluoric acid contained in the etchant, and therefore, there is no need to add a separate step of removing the oxidized silicon film before etching the grain boundaries 33. Accordingly, the manufacturing process can be simplified.

Moreover, after the grain boundaries 33 in the microcrystalline silicon layer 42 are removed, a hydrogenation treatment using hydrogen plasma may further be performed in order to terminate silicon dangling bonds present in the surface of the grains 31. In this case, the occurrence of defect levels is even more suppressed in the grains 31, and therefore, an OFF current can be further decreased.

Figure 8:
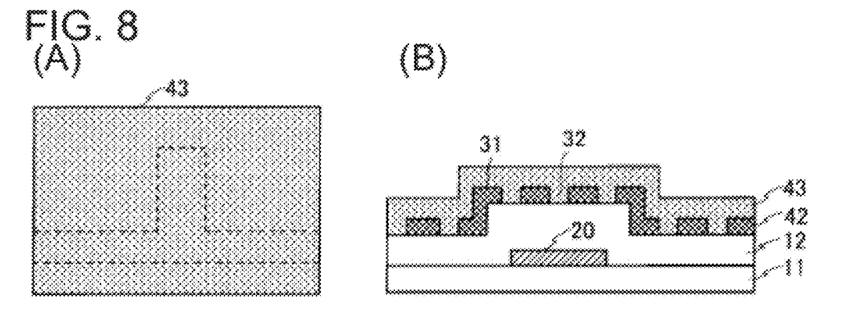

As shown in FIGS. 8(A) and 8(B), on a surface of the microcrystalline silicon layer 42 in which the gaps 34 have been formed, an amorphous silicon layer 43 with a film thickness ranging between 150 nm and 300 nm is formed by the plasma CVD method, for example. The amorphous silicon layer 43 uses monosilane (SiH$_4$) and hydrogen (H$_2$) as its source gases, and is formed under the condition same as that of the above-mentioned amorphous silicon layer 41. A part of the amorphous silicon layer 43 fills the gaps 34, which were formed in the microcrystalline silicon layer 42, to become the amorphous silicon regions 32, and the remainder is laminated on the microcrystalline silicon layer 42.

Here, the reason for setting a film thickness of the amorphous silicon layer 43 to a range between 150 nm and 300 nm, which is considerably larger than the film thickness of the microcrystalline silicon layer 42, will be explained. When the film thickness of the microcrystalline silicon layer 42 is 30 nm, a difference in level of 30 nm is formed between the surface of the microcrystalline silicon layer 42 and the surface of the gate insulation film 12. In order to form the amorphous silicon layer 43 on the surface of such a microcrystalline silicon layer 42 using a plasma CVD device, which is capable of forming a film at approximately 20 percent of a variation in film thickness, to planarize the surface of the amorphous silicon layer 43, the ratio of the level difference between the surface of the microcrystalline silicon layer 42 and the surface of the gate insulation film 12 to the total film thickness of the microcrystalline silicon layer 42 and the amorphous silicon layer 43 needs to be same as or smaller than the variation in thickness of a film formed by the plasma CVD device, that is, 20 percent or less.

When a film thickness of the amorphous silicon layer 43 is set to 150 nm, the ratio of the difference in level is approximately 17 percent, and when a film thickness of the amorphous silicon layer 43 is set to 300 nm, the ratio of the difference in level is approximately 9 percent. Therefore, if the film thickness of the amorphous silicon layer 43 is set in a range between 150 to 300 nm, an unevenness in the surface of the second silicon layer 35 can be made 20 percent or less. This makes it possible to improve the coatability of an n$^+$ silicon layer 51, a multilayer metal film for forming a source electrode 60a and a drain electrode 60b, and a protective film and the like, which will be formed above the channel layer 40 and which will be described later, and thereby suppresses in-plane characteristic variations of the TFT 10 formed on a large glass substrate 11 and secures the stability when aging occurs over a long period of time.

Further, when a variation in film thickness of the amorphous silicon layer 43 formed by a plasma CVD device changes, the film thickness of the amorphous silicon layer 43 necessary to planarize the surface of the second silicon layer 35 also changes accordingly. In this case, the larger the film thickness of the amorphous silicon layer 43, the more planarized the surface of the second silicon layer 35 becomes. However, if the film thickness of the amorphous silicon layer 43 is larger than 300 nm, the time it takes to form and etch the amorphous silicon layer 43 becomes long, causing a problem of lowering in production efficiency of the TFT 10. Thus, the upper limit of the film thickness of the amorphous silicon layer 43 is also limited by the time it takes to form and etch the film.

Figure 9:
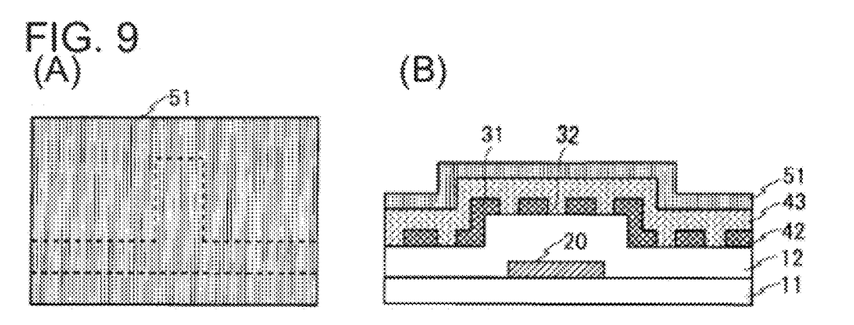

As shown in FIGS. 9(A) and 9(B), an n$^+$ silicon layer 51 with a film thickness of 50 nm, for example, that is doped with an n-type impurity in high concentration such as phosphorus (P) is formed. The n$^+$ silicon layer 51 is a silicon layer doped with phosphorus, which is an n-type impurity, and therefore, the n$^+$ silicon layer 51 is formed using monosilane (SiH$_4$) containing 0.5% of phosphine (PH$_3$) and hydrogen gas (H$_2$). Further, it is preferable that the amorphous silicon layer 43 and the n$^+$ silicon layer 51 be formed continuously by switching the source gas. This way, it is possible to prevent impurities from attaching to the interface between the amorphous silicon layer 43 and the n$^+$ silicon layer 51 so that interface states will not be formed.

Figure 10:
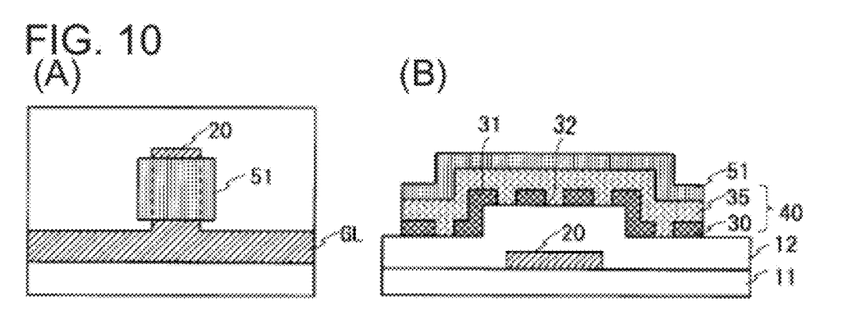

As shown in FIGS. 10(A) and 10(B), a resist pattern in a desired shape (not shown in the figure) is formed on the n$^+$ silicon layer 51 by photolithography. Then, using the resist pattern as a mask, the n$^+$ silicon layer 51, the amorphous silicon layer 43, and the microcrystalline silicon layer 42 are etched in top-to-bottom order, and then the resist pattern is removed. As a result, the amorphous silicon regions 32 and the grains 31 left on the gate insulation film 12 become the first silicon layer 30, and the amorphous silicon layer 43 becomes the second silicon layer 35. The channel layer 40 having the second silicon layer 35 being laminated on the first silicon layer 30 is formed in this manner.

Figure 11:
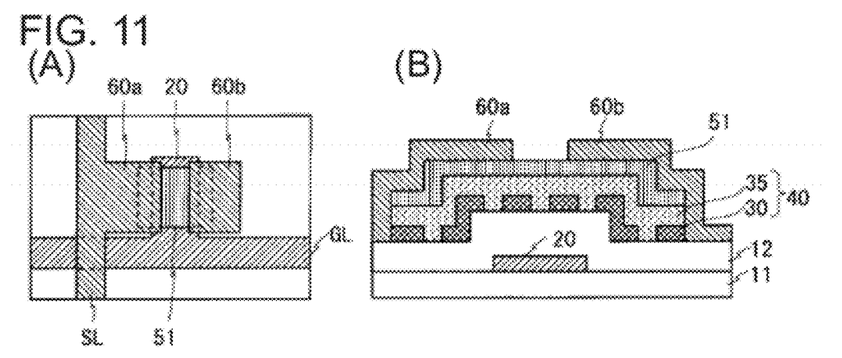

As shown in FIGS. 11(A) and 11(B), a multilayer metal layer (not shown in the figure) in which a titanium layer with a film thickness of 40 nm and an aluminum layer with a film thickness of 400 nm are laminated in this order is formed on the surface of the n$^+$ silicon layer 51 by spattering. A resist pattern in a desired shape (not shown in the figure) is formed on a surface of the multilayer metal layer by photolithography. Then, using the resist pattern as a mask, the aluminum layer and the titanium layer are etched in a top-to-bottom order by a dry-etching method to form the source electrode 60a and the drain electrode 60b. Next, the resist pattern is removed.

Figure 12:
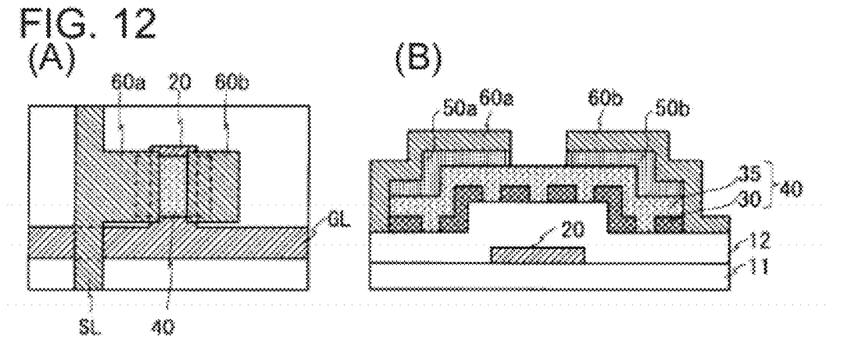

As shown in FIGS. 12(A) and 12(B), the n$^+$ silicon layer 51 is etched by a dry-etching method using the source electrode 60a and the drain electrode 60b as a mask, and ohmic contact layers 50a and 50b are formed below the source electrode 60a and the drain electrode 60b, respectively.

Figure 13:
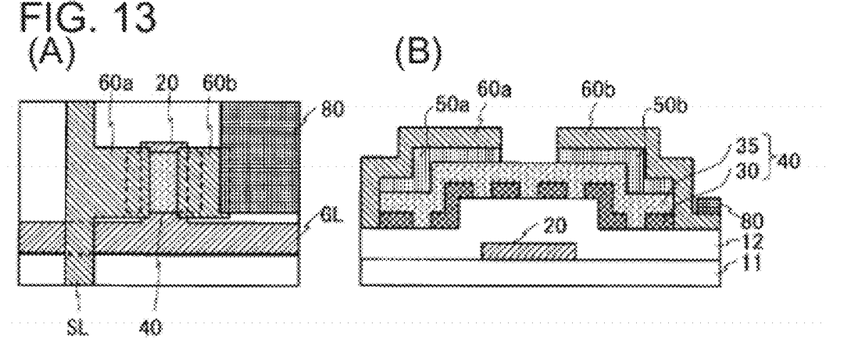

As shown in FIGS. 13(A) and 13(B), a transparent metal film (not shown in the figure) such as ITO (Indium Tin Oxide) is formed so as to cover the entire TFT 10. After the transparent metal film is etched using a resist pattern (not shown in the figure) formed on a surface of the transparent metal film as a mask, the resist pattern is removed. As a result, the pixel electrode 80, which covers an opening of the pixel forming portion and which is electrically connected to the edge of the drain electrode 60b, is formed. A protective film (not shown in the figure) such as a silicon nitride film is formed so as to cover the entire glass substrate 11 including the TFT 10 and the pixel electrode 80, and then the protective film over the pixel electrode 80 is removed to expose the surface of the pixel electrode 80. The TFT 10, which functions as a switching element of the pixel forming portion, is formed in this manner.

<3 Effects>

According to the TFT 10 of the present embodiment, the amorphous silicon regions 32 having a high hydrogen concentration are formed so as to surround the grains 31 in the first silicon layer 30, and therefore, many of the dangling bonds in the amorphous silicon region 32 are terminated by hydrogen, and defect levels are not likely to be formed in the amorphous silicon region 32. Accordingly, an OFF current that flows through defect levels can be decreased. Meanwhile, because the grains 31 remain in the first silicon layer 30, a large ON current can be maintained. As a result, the on-off ratio of the TFT 10 can be increased.

The concentration of hydrogen contained in the second silicon layer 35 is sufficiently high, as in the concentration of hydrogen in the amorphous silicon regions 32, and therefore, many of dangling bonds contained in the second silicon layer 35 are terminated by hydrogen. Accordingly, the occurrence of defect levels is also suppressed in the second silicon layer 35, thereby further decreasing an OFF current that flows through the defect levels. As a result, the on-off ratio of the TFT 10 can be increased.

The first silicon layer 30 is formed by carrying out laser annealing of the amorphous silicon layer 41 for crystallization. Therefore, the size of the grains 31 and the size of the grain boundaries 33 can easily be adjusted by changing the setting of the laser-annealing conditions. This way, the amounts of the ON current and the OFF current can easily be adjusted, and it is therefore possible to easily manufacture the TFT 10 having the large on-off ratio.

Because a wet-etching is used to remove the grain boundaries of the microcrystalline silicon layer 42, the grain boundaries 33 can be easily removed. Moreover, an oxide film, which is formed on a surface of the microcrystalline silicon layer 42 when laser-annealing is carried out on the amorphous silicon layer 41 to form the microcrystalline silicon layer 42, is also etched at the same time as the grain boundaries 33 are removed. Therefore, there is no need to add a step of removing the oxide film, and the TFT 10 can be manufactured at a low manufacturing cost.

<4. Modification Examples>

In the above-mentioned embodiment, the microcrystalline silicon layer 42 was formed by carrying out laser-annealing on the amorphous silicon layer 41, but the microcrystalline silicon layer 42 may directly be formed on the gate insulation film by a high density plasma CVD method. In the high density plasma CVD method, a CVD device of an inductive coupled plasma method, a surface wave plasma method, or an electron cyclotron resonance method is used. The microcrystalline silicon layer is formed under a high hydrogen concentration condition, such as where the pressure inside the chamber is set to $1.33 \times 10^{-1}$ to $4.00 \times 10$ Pa; monosilane and hydrogen are used as the source gases; and the flow ratio of monosilane-hydrogen is set to 1/100 to 1/10, for example.

Because the crystalline structure of the grains and the grain boundaries are different from each other also in the microcrystalline silicon layer formed in this manner, similarly to the above-described embodiment, the grain boundaries are removed by a wet-etching to form gaps surrounded by the grains. Then, the gaps are filled with an amorphous silicon layer to form the first silicon layer, and a second silicon layer made of an amorphous silicon layer is further formed on the first silicon layer. A TFT equipped with the channel layer formed in this manner has the same effects as those of the TFT 10, and also includes effects below specific to this TFT. Because the microcrystalline silicon layer is directly formed by the high density plasma CVD method, there is no need to include a laser-annealing step, and the manufacturing process can therefore be simplified. Moreover, because a device for laser-annealing is not necessary, it is possible to manufacture a TFT having the large on-off ratio at a low manufacturing cost.

In the above-mentioned embodiments, the microcrystalline silicon layer 42 was formed by crystallizing the amorphous silicon layer 41 by laser-annealing, but a polycrystalline silicon layer may be formed instead of the microcrystalline silicon layer 42. In this case, the energy density of excimer laser is set to approximately 350 nm; the grain size of the crystallized polycrystalline silicon layer is approximately 100 to 300 nm; and the size of the grain boundary is approximately 10 to 50 nm. The grains in the first silicon layer formed using a polycrystalline silicon layer becomes larger than the grains in the first silicon layer 30 formed using the microcrystalline silicon layer 42, and therefore, a large ON current flows. Meanwhile, in the gaps created so as to surround the grains, amorphous silicon regions similar to those in the first silicon layer 30 formed using the microcrystalline silicon layer 42 are formed, and therefore, the OFF current is small. Therefore, the on-off ratio of the TFT becomes even larger.

In the above-mentioned embodiment, the TFT 10 that is used for an active matrix type liquid crystal display device has been described, but the TFT 10 can also be used for an active matrix type organic EL device. As described above, the on-off ratio can be increased in the TFT, and therefore, the TFT is used as a switching element of a pixel forming portion in an active matrix type display device. Moreover, because an OFF current can be decreased, the TFT is used for a monolithic gate driver that drives a pixel forming portion.

Industrial Applicability

The present invention is applied to a matrix type display device such as an active matrix type liquid crystal display device and the like, and is especially suited for a transistor constituting a switching element in a pixel forming portion or a driver circuit in a matrix type display device.

DESCRIPTION OF REFERENCE CHARACTERS

10 Thin Film Transistor (TFT)
11 Glass substrate (insulating substrate)
20 Gate electrode
30 First silicon layer (first semiconductor layer)
31 Grain
32 Amorphous silicon region
33 Grain boundary
34 Gap
35 Second silicon layer (second semiconductor layer)
40 Channel layer
41 Amorphous silicon layer (second amorphous semiconductor layer)
42 Microcrystalline silicon layer
43 Amorphous silicon layer (first amorphous semiconductor layer)
50*a*, 50*b* Ohmic contact layers
60*a* Source electrode
60*b* Drain electrode

The invention claimed is:

1. A bottom-gate thin film transistor formed on an insulating substrate, comprising:
   a gate electrode formed on said insulating substrate;
   a gate insulation film formed so as to cover said insulating substrate including said gate electrode; and
   a channel layer including a first semiconductor layer formed on said gate insulation film and a second semiconductor layer formed on said first semiconductor layer,
   wherein said first semiconductor layer includes a plurality of grains and amorphous semiconductor regions that are made of first amorphous semiconductor and that fill gaps surrounded by said grains, and
   wherein said amorphous semiconductor regions contain hydrogen in an amount sufficient to terminate dangling bonds contained therein.

2. The thin film transistor according to claim 1,
   wherein said second semiconductor layer is made of second amorphous semiconductor, and
   wherein a concentration of hydrogen contained in said second semiconductor layer is equal to a concentration of hydrogen contained in said amorphous semiconductor regions.

3. A display device equipped with the thin film transistor according to claim 1.

4. A method for manufacturing a bottom-gate thin film transistor formed on an insulating substrate, comprising:
   forming a gate electrode on said insulating substrate;
   forming a gate insulation film so as to cover said insulating substrate including said gate electrode; and
   forming a channel layer on said gate insulation film,
   wherein the step of forming the channel layer includes:
      forming a crystalline semiconductor layer on said gate insulation film,
      removing grain boundaries contained in said crystalline semiconductor layer to form gaps, and
      forming a first amorphous semiconductor layer in said gaps in said crystalline semiconductor layer and on said crystalline semiconductor layer.

5. The method for manufacturing a thin film transistor according to claim 4, wherein the step of forming the crystalline semiconductor layer includes:
   forming a second amorphous semiconductor layer on said gate insulation film; and
   performing laser annealing of said second amorphous semiconductor layer for crystallization.

6. The method for manufacturing a thin film transistor according to claim 5, wherein a film thickness of said second amorphous semiconductor layer is a film thickness in which sidewalls of said grain boundaries, which are formed when performing laser annealing on said second amorphous semiconductor layer, become approximately perpendicular to said gate insulation film.

7. The method for manufacturing a thin film transistor according to claim 5, wherein said first amorphous semiconductor layer is formed such that a ratio of a film thickness of said second amorphous semiconductor layer to a total film thickness of said first amorphous semiconductor layer's film thickness and said second amorphous semiconductor layer's film thickness becomes smaller than a variation ratio in film thickness of said first amorphous semiconductor layer.

8. The method for manufacturing a thin film transistor according to claim 4,
   wherein the step of removing the grain boundaries contained in said crystalline semiconductor layer to form the gaps includes performing a wet etching using an etchant having nitric acid and hydrofluoric acid as main components thereof.

9. The method for manufacturing a thin film transistor according to claim 4, wherein said crystalline semiconductor layer is a microcrystalline semiconductor layer formed by a high density plasma CVD method.

\* \* \* \* \*